US012516439B2

(12) United States Patent
Sweet et al.

(10) Patent No.: US 12,516,439 B2
(45) Date of Patent: Jan. 6, 2026

(54) SINGLE CRYSTAL YIG NANOFILM FABRICATED BY A METAL ORGANIC DECOMPOSITION EPITAXIAL GROWTH PROCESS

(71) Applicant: Vida Products, Rohnert Park, CA (US)

(72) Inventors: Allen Sweet, Alameda, CA (US); Szu-Fan Wang, El Cerrito, CA (US); Kai Chorazewicz, Simi Valley, CA (US)

(73) Assignee: VIDA PRODUCTS, Rohnert Park, CA (US)

( * ) Notice: Subject to any disclaimer, the term of this patent is extended or adjusted under 35 U.S.C. 154(b) by 397 days.

(21) Appl. No.: 18/044,072

(22) PCT Filed: Aug. 31, 2021

(86) PCT No.: PCT/US2021/071331
§ 371 (c)(1),
(2) Date: Mar. 3, 2023

(87) PCT Pub. No.: WO2022/051750
PCT Pub. Date: Mar. 10, 2022

(65) Prior Publication Data

US 2024/0003042 A1 Jan. 4, 2024

Related U.S. Application Data

(60) Provisional application No. 63/203,391, filed on Jul. 20, 2021, provisional application No. 62/706,698, filed on Sep. 3, 2020.

(51) Int. Cl.
*C30B 29/28* (2006.01)
*C30B 1/02* (2006.01)
(Continued)

(52) U.S. Cl.
CPC .............. *C30B 1/023* (2013.01); *C30B 29/28* (2013.01); *H01F 41/28* (2013.01); *H01F 41/301* (2013.01)

(58) Field of Classification Search
CPC ......... C30B 1/023; C30B 29/28; H01F 41/28; H01F 41/301
See application file for complete search history.

(56) References Cited

U.S. PATENT DOCUMENTS

2005/0111073 A1* 5/2005 Pan ......................... G02F 1/093 359/280

FOREIGN PATENT DOCUMENTS

CN 104193316 * 2/2017
CN 110373713 A * 10/2019 ........... C23C 14/185
JP 2015179746 A * 10/2015

OTHER PUBLICATIONS

Dubs et al Low damping and microstructural perfection of sub-40nm-thin yttrium iron garnet films grown by liquid phase epitaxy Physical Review Materials 4, 024416 (2020).*

* cited by examiner

*Primary Examiner* — Robert M Kunemund
(74) *Attorney, Agent, or Firm* — Christopher Pilling

(57) ABSTRACT

A MOD YIG epitaxial process for fabricating YIG nanofilms which, when deposited on GGG substrates, have single crystal epitaxial properties. The films may have thicknesses of 50 nm for a single layer, 100 nm for two layers, and 130 nm for three layers, and have a gyromagnetic ratio of 2.80 MHz per Oe, Gilbert damping ranges from 0.0003 to 0.001, 4πM$ values between 1650 G to 1780 G, coercivity from 1 Oe. to 5 Oe, and surface roughness of RMS 0.20 nm for up to 10 layers. Fabrication is economical and uses only a spinner, a drying station (RT to 150 C temperature control), and a quartz tube furnace that accommodates a flowing
(Continued)

ANNEALING FURNACE SCHEMATIC atmosphere of research grade oxygen, thereby eliminating the need for high vacuum deposition chambers.

18 Claims, 16 Drawing Sheets

(51) Int. Cl.
*H01F 41/28* (2006.01)
*H01F 41/30* (2006.01)

70

| | Use | 2Theta/Omega(°) | Fringe Period (°) | Thickness (um) |
|---|---|---|---|---|
| ▲ | ☒ | 50.61724 - 50.69446 | 0.07722 | 0.128598 |
| | ☒ | 50.69446 - 50.77821 | 0.08375 | 0.118611 |
| | ☒ | 50.77821 - 50.85418 | 0.07597 | 0.130793 |
| | ☒ | 50.85418 - 50.92834 | 0.07416 | 0.134021 |

| Process | Y | $4\pi Ms$ | ΔH0 | ΔH fwhm | F0 | DAMPING | ROUGHNESS | THICKNESS |
|---|---|---|---|---|---|---|---|---|
| LPE | 2.8 MHZ/Oe | 1650-1850 G | 1.4-2.0 Oe | 1.4-1.5 Oe | 6.6 GHZ | .0004-.003 | 0.3-0.8 nm | 80-3000 nm |
| PLD | 2.8 | 1720 | 1.3-3.4 | 3.0 | 10.0 | 0.00074-.004 | 0.20-0.30 | 20-200 |
| SPUTTERING | 2.8 | 1640-1780 | 7-25 | 6.6-12.0 | 16.5 | .008-.013 | 0.20-0.40 | 7-30 |
| MOD EPI | 2.8 | 1650-1780 | 4.5-12.0 | 5.0 - 20 | 17.0 | .0003 to .001 | 0.13-0.20 | 57-570 |

*FIG. 18*

SINGLE CRYSTAL YIG NANOFILM FABRICATED BY A METAL ORGANIC DECOMPOSITION EPITAXIAL GROWTH PROCESS

BACKGROUND OF THE INVENTION

Technical Field

The present invention relates most generally to resonators for electrical circuits, and more particularly to tunable resonators, and still more particularly to methods for fabricating nanofilms for use in tunable resonators, yet more particularly to a metal organic deposition (MOD) process (i.e., a YIG epitaxial process) for fabricating a YIG thin film having the molecular formula of $Y_3Fe_5O_{12}$ (Y[sub3]Fe [sub5]O[sub12]), the process involving the method steps of coating a precursor liquid consisting of a mixture of yttrium oxide, iron oxide, and various acids and organic substances onto a specially heat-treated gallium gadolinium garnet ($Gd_3Ga_5O_{12}$) GGG substrate, drying the precursor liquid at a slightly elevated temperature to produce a very thick metal organic film, and then annealing the resulting thin film. The resulting single crystal YIG thin film has several advantageous and unique physical and magnetic properties.

Background Discussion

A 1935 paper published by Lev Landau and Evgeny Lifshitz, predicted the existence of ferromagnetic resonance, which was independently verified in experiments by J. H. E. Griffiths (UK) and E. K. Zavoiskij (USSR) in 1946.

FMR precession is the basic underlying magnetic principle that is occurring in various crystalline materials, in particular YIG ($Y_3Fe_5O_{12}$). A whole group of electronic devices rely on FMR to obtain a tunable magnetic resonance resulting from electron spin precession occurring within the material's atoms. Most of these electronic devices make use of FMR occurring within Yttrium Iron Garnet (YIG) material.

For several decades Yttrium Iron Garnet material has found wide application in ultra-low phase noise, widely tunable microwave and mm wave oscillators and bandpass filters. YIG technology has very significant advantages over the traditional varactor diode tuned VCO oscillator technology. Replacing VCO technology with the equivalent YIG technology holds the promise of significantly increasing the data rate of emerging 5G cellular networks, by reducing oscillator phase noise by up to 40 dB or more relative to CMOS VCOs.

Approximately 4 billion people on earth own smart phones. Every year about 1.5 billion new smart phones are manufactured. As 5G cellular ramps up worldwide, the demand for low phase noise high data rate oscillators will significantly increase. In addition to cell phones, over the past decade many new applications for YIG nanofilms such as spintronic, and magnetostatic surface spin waves (MSSW) delay lines. (MSSW) devices are usually fabricated using YIG films that are between 1 μm and 5 μm as are other types of spin wave devices. MSSW and MSW devices find application in microwave isolators, circulators, limiters and in amplifier/oscillator feedback oscillators. Also, on the horizon are magnonic transistors, magnonic logic gates and quantum computing, each of which is now gaining wide ranging research interest. In addition, such advanced concepts such as spin pumping, spin hall effect and reverse spin hall effect are also under research investigation. YIG material is of the highest importance within these new applications because of YIG's outstanding magnetic characteristics (See table I for a comparison of the FMR characteristics of various types of epitaxial YIG) and their ability to be fabricated into very thin nanofilm layers that can easily be metalized.

Most of the above-mentioned applications require YIG nanofilms that are single crystal rather than polycrystalline. From this respect, epitaxial growth in all its various forms is the surest, most direct way to produce single crystal YIG nanofilms. However, all of the well-known YIG epitaxial growth techniques, including LPE, PLD, and Sputtering, involve expensive fabrication tools which must carry out the required depositions under high vacuum conditions. These processes are not well suited to high volume manufacturing conditions of the kind needed for commercially manufactured 5G cellular handsets and infrastructure.

Achieving single crystal epitaxial mod YIG nanofilms: All single crystal growth processes require a "seed" crystal to pattern the growth of new crystals based on copying the lattice structure of the seed. In the case of epitaxial film growth, the substrate itself plays the role of the seed. If the substrate is of the same material as the film to be grown, the epitaxial process is called homoepitaxy. If the substrate is of a different material than the film to be grown, the epitaxial process is called heteroepitaxy.

Multilayer MOD YIG films behaves like a single layer YIG film of greater thickness: The traditional MOD deposition process, schematically illustrated in FIG. 1 and denominated 1, starts with a liquid precursor 2 containing metal-organic compounds in the right proportion of elements (i.e., yttrium, iron, and oxygen obeying the ratios that form $Y_3Fe_5O_{12}$). The precursor is then spun on to the substrate 3 and dried 4 for some time (1 to 24 hours) allowing organic volatiles to escape as out gassing. After drying, the sample is heated to an intermediate temperature (e.g., about 300 C) where "pyrolysis" takes place 5. During pyrolysis the metal-organic compounds within the precursor are decomposed (i.e., broken down into their metal elements plus free bits of organic compounds) so that the metal atoms will begin finding each other in order to form the desired crystal structure. As the name implies "pyrolysis" is in fact an extraordinarily complex process of thermal chemistry. The next step in the process is annealing 6 where the sample is subjected to very high temperatures (i.e., 700 C to 800 C). In the standard MOD process, annealing happens when the crystals being formed clump together into grains of several microns each, creating at best a polycrystalline film. There is also a problem of surface roughness with polycrystalline MOD YIG films that is related to the graininess of their polycrystalline composition.

The foregoing background discussion reflects the historical and current state of the art of which the present inventors are aware. Reference to, and discussion of, this background patents is intended to aid in discharging Applicants' acknowledged duty of candor in disclosing information that may be relevant to the examination of claims to the present invention. However, it is respectfully submitted that none of the teachings in known prior art publications, products, products by processes, or methods of fabricating epitaxial nanofilms disclose, teach, suggest, show, or otherwise render obvious, either singly or when considered in combination, the invention described and claimed herein.

DISCLOSURE OF INVENTION

The inventive fabrication process is a Metal Organic Decomposition (MOD) YIG epitaxial growth process, which is inexpensive to implement based on both its low process fabrication costs and its low capital equipment cost.

The inventive process begins by selecting and providing a substrate for the epitaxial growth process, and thereafter with the selection of a precursor liquid containing the desired metal elements in their correct ratio to support YIG crystal synthesis in cooperation with the substrate. The choice of substrate, namely, gadolinium gallium garnet ($Gd_3Ga_5O_{12}$) 111-oriented substrate (referred to herein as "GGG(111)", or simply "GGG"), provides a very close lattice match to YIG. The lattice constant for GGG is 12.37 Angstroms, while the lattice constant for YIG is 12.38 Angstroms, and YIG is the resulting crystal desired in the present inventive process. It is in this respect that the inventive process departs from traditional MOD YIG epitaxy fabrication, which uses silicon as a substrate. The GGG(111) substrate plays the role of the "seed" in the film fabrication process.

In a first fabrication step, the substrate is cleaned in acetone and isopropyl alcohol, and it is then annealed at high temperatures (1100 C for four hours) in an atmosphere of research grade oxygen to "heal" the substrate surface roughness to enable the GGG(111) substrate to act as a truly high quality "seed" for the heteroepitaxial growth. YIG films grown by this technique are truly single crystal because of the close lattice match between GGG and YIG. This is comparable to other epitaxial YIG processes—e.g., pulsed laser deposition (PLD), liquid phase epitaxy (LPE), sputter deposition ("sputtering"). Annealing the GGG substrate is necessary because un-annealed GGG substrates cause distortions in the sample's hysteresis curves (i.e., B-H curves) as measured by VSM. The surface roughness of the GGG substrates prepared in this way ranges from RMS 0.10 nm to RMS 0.25 nm.

The precursor is then spun onto the GGG(111) substrate and allowed to dry for 24 hours at room temperature (an alternative time saving drying procedure is 150 C for 1 hour). By the time the sample has dried, most of the organic volatiles have already escaped by out gassing. Any remaining organic molecules are eliminated in a single high temperature annealing process performed at approximately 1100 C for approximately four hours in a quartz tub furnace filled with a flowing research grade oxygen atmosphere. This is a combination process step that is called a "crystallization" step simply because crystallization is accomplished at this point as a combination of three overlapping and concurrently conducted processes: (1) pyrolysis, where decomposition of the metal-organic compounds occurs; (2) annealing in an oxygen atmosphere, where any remaining organic material is eliminated; and (3) crystallization, where the elemental metal atoms of the YIG lattice structure combine with oxygen atoms to form a single crystal YIG film according to the lattice "pattern" provided by the nearly identical lattice structure of the GGG(111) substrate.

The resulting coating ranges across the entire surface of the sample and comprises a single crystal epitaxial layer of YIG film, achieved in essentially the same way that epitaxial YIG films are grown onto GGG substrates using PLD, sputtering, and LPE processes. Atomic force microscopy (AFM) testing shows that the surface roughness of the MOD YIG films resulting from the present invention is always close to RMS 0.20 nm (even when layers are deposited one YIG layer on top of another layer for up to ten layers). Layers succeeding the first, or "base" layer, use the immediately preceding layer below as the "seed" for homoepitaxy deposition of the layer above. X-ray diffraction (XRD) analysis has shown that in the case of three YIG layers deposited one layer on top of another there is no sign of boundary layer discontinuities as would be indicated by the reflections of the X-rays at multiples of a single YIG layer thickness (i.e., 50 nm). Also, the surface roughness measured by AFM after each layer's deposition remains unchanged at RMS 0.20 nm, indicating that there is no "roughness buildup" when depositing multiple YIG layers. This finding holds true no matter how many YIG layers are grown and stacked one on top of another. Experiments involving deposits of up to 10 layers show that there is no deviation from the RMS 0.20 nm rule. The MOD EPI YIG material will always have a thickness of approximately N times the thickness of each layer, where N is the number of deposited layers.

Upon final annealing, all composite layers "meld" together into a single crystal epitaxial layer with no sign of boundary layer discontinuities. Each YIG layer provides a perfect homoepitaxial substrate seed for the next layer. In fact, a YIG film represents a more accurate seed than the GGG(111) substrate employed as the "seed" for only the first layer. It is anticipated that only the initial layer would be subject to any kind of roughness error buildup caused by slight lattice mismatch between the GGG(111) substrate and the YIG film. All higher layers are YIG on top of YIG, which is the perfect setup for homoepitaxy.

Numerous journal articles discuss a phenomenon called "atomic terrace formation" in which a "step" in the height of a crystal film surface corresponds to the dimension of a single atom that develops at the surface of a cubic crystal structure of epitaxial YIG film. Journal literature suggests that with YIG films the "atomic terrace" has a step-in height in the range of 1 to 2 Angstroms (i.e., RMS 0.10 nm to 0.20 nm), which is what is observed with the epitaxial YIG films resulting from the fabrication method disclosed herein. Therefore, it is predicted that the surface roughness observed in single crystal epitaxial YIG films is, in fact, determined by only a single atomic height dimension.

The present inventors know of no other researchers who have reported obtaining single crystal epitaxial growth using the MOD process. What is truly unique and advantageous about the inventive MOD EPI DEPOSITION process is that it is a fast, simple, and inexpensive process requiring no complex and expensive high vacuum processing equipment, or long process duration times (unlike all other known YIG epitaxial processes). The inventive process could in principle be extended across a whole wafer diameter simply by adding a larger diameter spinner and a larger diameter tube furnace. However, evaluations of defect density and yields associated with large GGG(111) wafers would have to be conducted to validate such a process.

From the foregoing, it will be appreciated that in its most essential aspect, the present invention is a fabrication process (MOD EPI) whereby a precursor liquid consisting of a mixture of Yttrium oxide, Fe oxide, and various acids and other organic substances is combined with a specially heat treated GGG substrate to yield a thin film of $Y_3Fe_5O_{12}$ (YIG) with unique physical and magnetic properties.

The inventive method yields epitaxial YIG films that may be deposited one on top of another to provide a total YIG film thickness in the range of 50 nm to 500 nm, in steps of nm. This material has a surface roughness between RMS 0.10 nm and 0.20 nm regardless of the number of layers.

The inventive method first employs a spinning process of between 3000 rpm to 6000 rpm to coat a pre-annealed GGG substrate with a thin film of precursor liquid. The spinning process completely and evenly distributes the precursor liquid across and over the planar GGG substrate surface.

After the spinning step, the liquid precursor is dried on the GGG substrate in a precursor drying step lasting from 1 hour to 24 hours at a temperature ranging between 25 C to 150 C, inclusive.

After the drying step, the resulting dried YIG thin film is annealed (pyrolyzed, annealed, and crystallized) at approximately 1100 C for approximately 4 hours in a quartz tube furnace with a flowing research grade oxygen. This removes all organic material from the film and enables single crystal, crystallization to occur along the entire MOD EPI thin film YIG layer. Temperatures outside the stated range re contemplated, though below a temperature of 600 C, the annealing will not yield a suitable product, and above 1500 C, the thin film will simply burn off the substrate.

The resulting single crystal nature of the resulting MOD EPI YIG film layers have been experimentally proven by using three independent measurement techniques: EBSD, XRD, and ferromagnetic resonance.

In a multilayer construction of the MOD EPI YIG nanofilms, the ferromagnetic resonance linewidth at frequencies above 10 GHz can be substantially reduced. This occurs because of a phenomenon called "two magnon scattering", which has the effect of increasing the quality factor (Q) of the YIG film's ferromagnetic resonance as a rising function of frequency. In oscillator applications the high frequency increase in quality factor (Q) leads to flat or decreased phase noise at high frequencies. By contrast, CMOS VCO's have quality factors that decrease significantly at high frequencies due to "skin effect" properties within the metals that compose the CMOS transistors. For example, at C-band 5G frequencies, MOD EPI YIG thin films have a quality factor (Q) in the range of 200, while CMOS VCO's have a quality factor (Q) of less than 2.0. Based on the differences in quality factor, it may be reasonably expected that a MOD EPI YIG oscillator will have phase noise more than 40 dB below that of a CMOS VCO at the same frequency (i.e., the phase noise ratio in dB would be 20 log (200/2)=20 log (100)=40 dB)

The chemical composition of the precursor liquid provides significant performance advantages in terms of the resulting MOD EPI YIG film's ferromagnetic properties.

The in-plane ferromagnetic saturation magnetization of MOD EPI YIG nanofilms made by the inventive method is within the range of 1600 gauss to 1800 gauss.

The in-plane gyromagnetic ratio of the MOD EPI YIG nanofilms is in the range of 2.78 MHz/Oe to 2.82 MHz/Oe The in-plane ferromagnetic inhomogeneous linewidth of the MOD EPI YIG nanofilms is in the range of 6 Oe to 20 Oe The in-plane magnetic coercivity of the MOD EPI YIG nanofilms is within the range of 1 Oe to 5 Oe.

The Gilbert damping ratio of the MOD EPI YIG nanofilms is in the range of 0.0003 to 0.001.

Exposing MOD EPI YIG nanofilms to a steady state magnetic field of 1000 gauss or more during fabrication may lead to further advantageous properties.

As will be clear from the foregoing, an objective of the present invention is to grow a single layer YIG crystal. Therefore, a substrate of single crystal YIG material or a substrate of a material whose crystal structure is essentially identical to that of YIG must be employed. GGG(111) was chosen as a substrate material because both YIG and GGG have a cubic crystal structure with lattice constants that are nearly identical (YIG's lattice constant is 12.38 Angstroms, and GGG's lattice constant is 12.37 Angstroms). To the knowledge of the present inventors, this is the first time that GGG has been used as a substrate material for MOD deposition. Therefore, to grow single crystal epitaxial YIG films, the inventive method substitutes GGG for silicon as the substrate material. Based on the reported annealing temperature schedules chosen by several PLD researchers, 1100 C for four hours was selected as the final annealing temperature schedule for epitaxial YIG growth on the GGG substrate.

Four well-known measurement techniques have confirmed single crystal YIG epitaxial growth on GGG. The measurements—including electron backscatter diffraction (EBSD), X-ray diffraction (XRD), ferromagnetic resonance spectroscopy (FMR) measurements for Gilbert damping and inhomogeneous damping constant, and vibrating sample magnetometer (VSM) measurements—demonstrate the validity of the single crystal nature of an initial 50 nm thick YIG nanofilms grown on GGG substrates.

Glossary: As used herein, acronyms and abbreviations may be defined as follows:

EPI is an abbreviation for epitaxial which is a thin layer of single crystal material that is grown on a substrate of the same or different material.

LPE is liquid phase epitaxy. In LPE the substrate is brought in contact with a melt of the material to be deposited and at pre understood deposition rate the epitaxial layer is formed.

PLD is an abbreviation for pulsed laser deposition. PLD is often used for depositing very thin and very uniform YIG layers on GGG substrates.

FMR is an abbreviation for ferromagnetic resonance.

VSM indicates a test called vibrating sample magnetization.

YIG is a garnet crystal, $Y_3Fe_5O_{12}$.

GGG is a garnet crystal, $Gd_3Ga_5O_{12}$.

VCO is a voltage-controlled oscillator.

MTI is a supplier of both YIG and GGG substrates.

XRD stands for X-ray diffraction testing.

AFM is an abbreviation for a test technique called "Atomic force measurement"; its primary use is in measuring surface roughness.

MO is an abbreviation for "Magnetic Optical" and refers to applications using magnetic fields to control optical signals. Most MO devices use the Kerr effect as their operational principle.

MOKE stands for "Magnetic Optical Kerr Effect" and is a measurement technique for determining the magnetic properties of various crystals.

RMS is a mathematical abbreviation for root mean square, which is defined as the square root of the mean square.

EBSD stands for the measurement technique called "Electron Back Scatter Diffraction", which has the capability to distinguished single crystal samples from polycrystalline samples.

The foregoing summary broadly sets out the more important features of the present invention so that the detailed description that follows may be better understood, and so that the present contributions to the art may be better appreciated. There are additional features of the invention that will be described in the detailed description of the preferred embodiments of the invention which will form the subject matter of the claims appended hereto.

Also, it is to be understood that the terminology and phraseology employed herein are for descriptive purposes only, and not limitation. Where specific dimensional and material specifications have been included or omitted from the specification or the claims, or both, it is to be understood that the same are not to be incorporated into the appended claims.

Those skilled in the art will appreciate that the conception, upon which this disclosure is based may readily be used as a basis for designing other structures, methods, and systems for carrying out the several purposes of the present invention. It is important, therefore, that the claims are regarded as including such equivalent constructions as far as they do not depart from the spirit and scope of the present invention. Rather, the fundamental aspects of the invention, along with the various features and structures that characterize the invention, are pointed out with particularity in the claims annexed to and forming a part of this disclosure. For a better understanding of the present invention, its advantages and the specific objects attained by its uses, reference should be made to the accompanying drawings and descriptive matter in which there are illustrated the preferred embodiment.

BRIEF DESCRIPTION OF SEVERAL VIEWS OF THE DRAWINGS

The invention will be better understood and objects other than those set forth above will become apparent when consideration is given to the following detailed description thereof. Such description makes reference to the annexed drawings wherein:

FIG. 18 is a table comparing the MOD YIG epitaxial nanofilm as fabricated by the inventive method compared with FMR data of other leading YIG epitaxial processes.

DETAILED DESCRIPTION OF THE INVENTION

Figure 1:
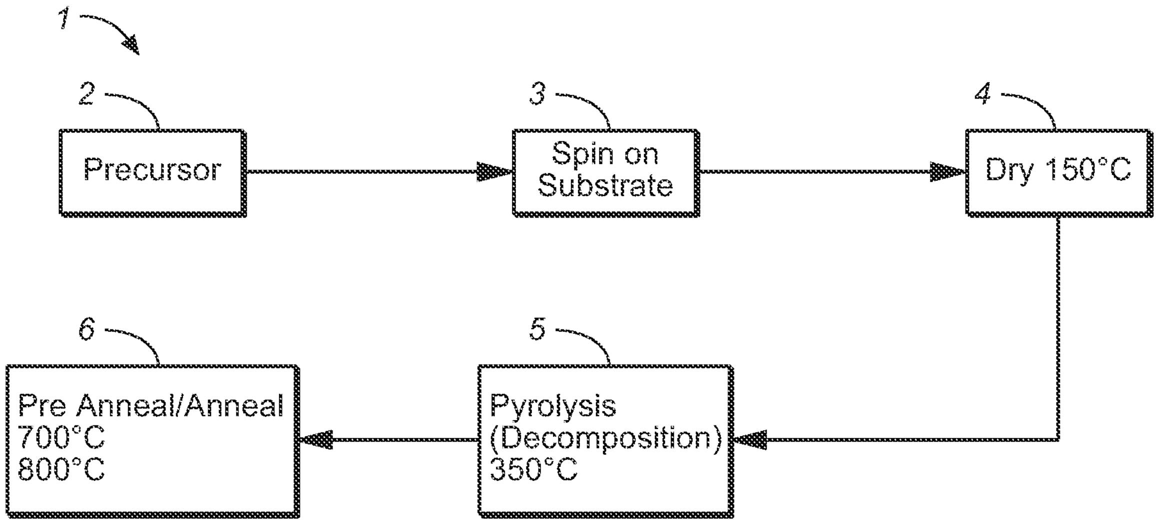
FIG. 1 (PRIOR ART)
FIG. 1 is a schematic block diagram of a prior art MOD epitaxial YIG fabrication process.
Figure 2:
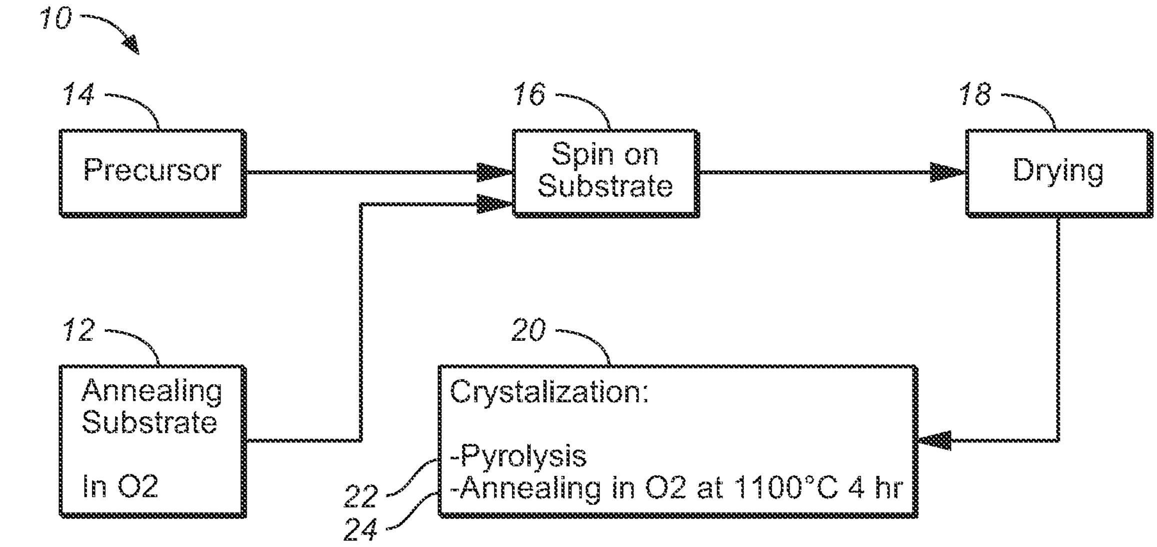
FIG. 2 is a schematic block diagram of the inventive MOD epitaxial YIG nanofilm fabrication process.
Figure 3:
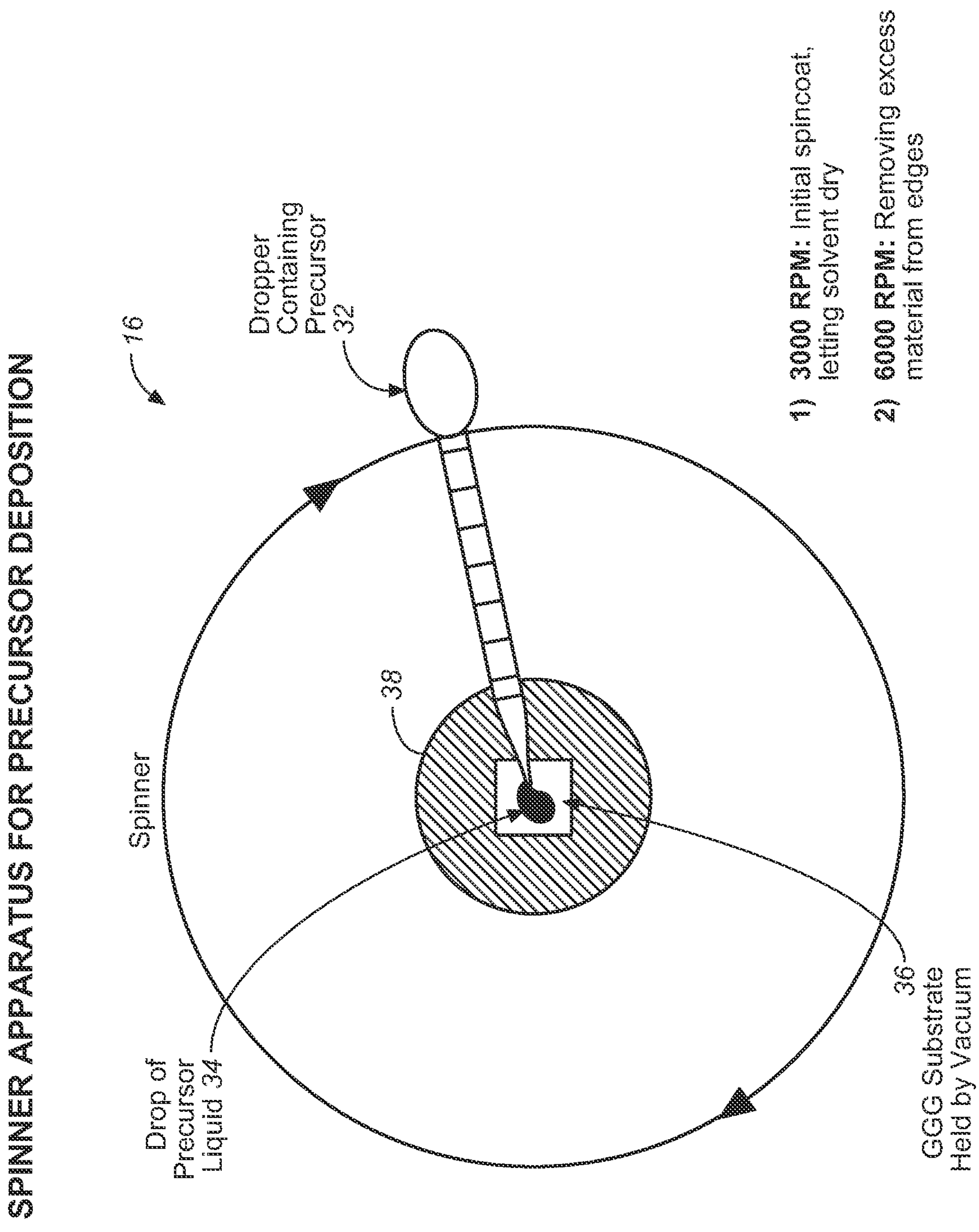
FIG. 3 is a top plan schematic view of a spinner apparatus for carrying out the spin coating step for deposition of a precursor liquid onto a GGG(111) substrate.
Figure 4:
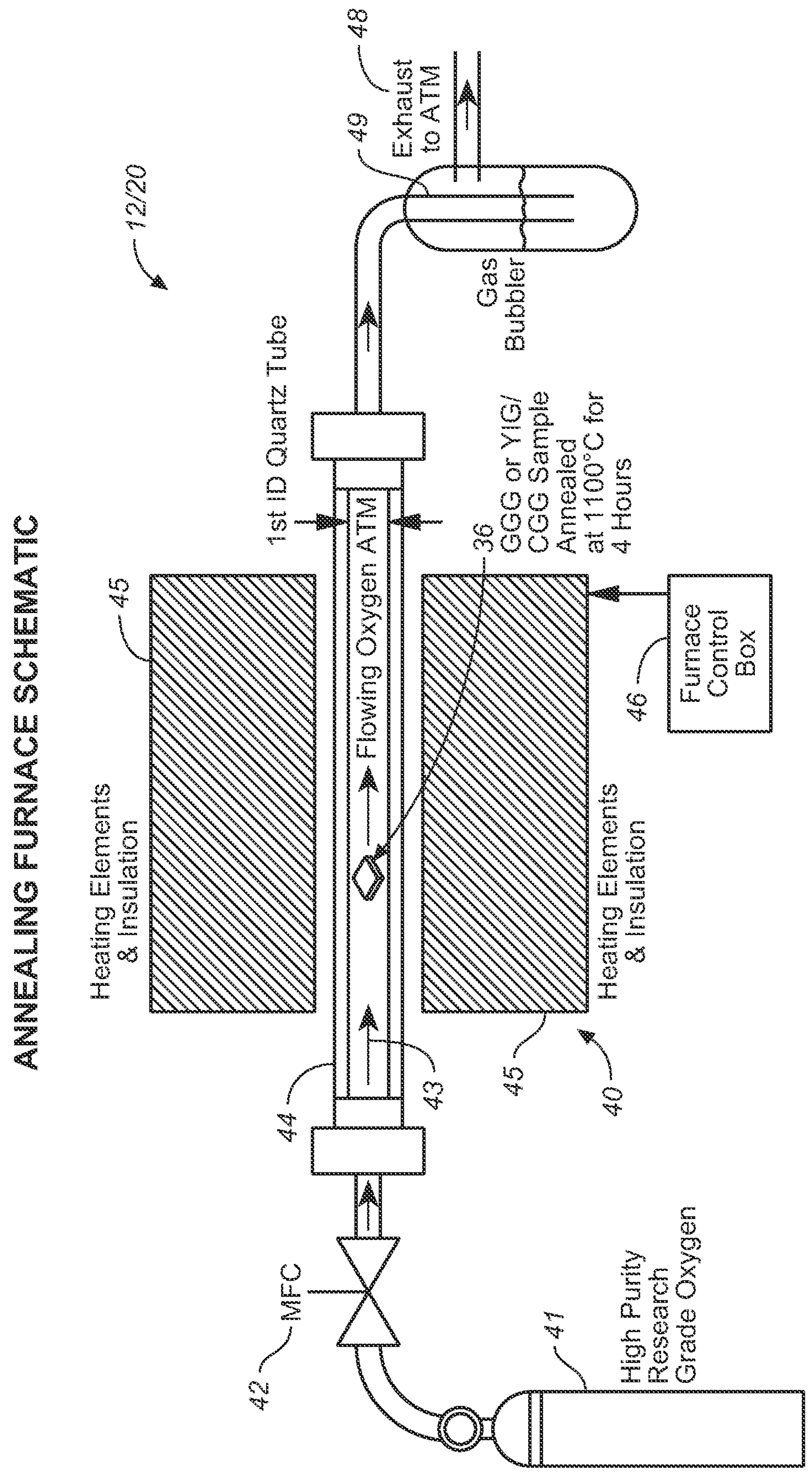
FIG. 4 is schematic diagram showing a quartz tube annealing furnace of the kind employed in the annealing step in the inventive MOD YIG epitaxial nanofilm fabrication process of the present invention.

Referring now to FIGS. 2 through 4, wherein like reference numerals refer to like components in the various views, there is illustrated therein a new and improved metal organic decomposition epitaxial growth process for making YIG nanofilms. The process is generally denominated 10 herein [see FIG. 2].

FIG. 2 schematically illustrates the basic method steps of an embodiment of the inventive method. As can be seen, the method includes: (1a) providing a suitable crystalline substrate, the substrate having a surface with a lattice constant substantially identical to that of YIG, the preferred substrate being GGG(111), and (1b) annealing the substrate surface in an annealing furnace 12; (2) providing and then depositing onto the substrate surface a precursor liquid mixture containing yttrium, iron, and oxygen in predetermined proportions 14; (3) evenly distributing the precursor liquid using a spin coating process to completely and evenly coat the substrate surface 16; (4) drying the precursor liquid on the substrate surface to form a thin film YIG layer; and (5) crystallizing the thin film YIG layer 20 by heating the thin film YIG layer at a first high temperature to pyrolize the layer to remove all organic material from the thin film YIG layer 22, and to anneal the thin film layer at a higher second temperature to remove any remaining organic materials, and to promote single crystal, crystallization to occur across the entire thin film YIG layer 24.

In embodiments, the precursor liquid consists of yttrium oxide, iron oxide, and one or more acids and one or more organic substances.

In embodiments, the precursor composition is a solution comprising:

| Ingredient | Formula | Conc. by % Wt |
|---|---|---|
| Iron Oxide (III) | Fe2O3 | 1.1 TO 1.3 |
| Yttrium Oxide | Y2O3 | 1.7 TO 1.9 |
| 2-Ethylhexanoicacid | C4H9CH(C2H5) COOH | 13 TO 18 |
| Stabilizer A, B | *CxHyOz* | 8 TO 13 |
| Turpentine | — | 41 TO 46 |

-continued

| Ingredient | Formula | Conc. by % Wt |
|---|---|---|
| N-Butylacetate | CH3COOC4H9 | 19 TO 24 |
| Ethylacetate | CH3COOC2H5 | 6 TO 8 |

Alternative ("variant") formulations for the liquid precursor solution include:

| Ingredient | Formula | Conc. by % Wt |
|---|---|---|
| | Variant #1 | |
| Iron Oxide (III) | Fe2O3 | 2.2 to 2.6 |
| Yttrium Oxide | Y2O3 | 1.7 to 1.9 |
| Turpentine | — | 40 to 45 |
| | Variant #2 | |
| Iron Oxide (III) | Fe2O3 | 1.1 to 1.3 |
| Yttrium Oxide | Y2O3 | 2.4 to 3.3 |
| Turpentine | — | 40 to 45 |
| | Variant #3 | |
| Iron Oxide (III) | Fe2O3 | 2.2 to 2.6 |
| Yttrium Oxide | Y2O3 | 2.4 to 3.3 |
| Turpentine | — | 39 to 44 |

In embodiments, the crystalline substrate is GGG, and in further embodiments, GGG(111).

FIG. 3 is a schematic view of the spinner apparatus employed in the spinning step 16 shown in FIG. 2. The step includes using a dropper 32 to deposit a drop of precursor liquid 34 onto a pre-annealed GGG(111) substrate surface 36 disposed on a spinner vacuum plate 38, to evenly coat the GGG(111) substrate surface. The spinning may be carried out in two steps, including an initial spincoat at a first speed (e.g., 3000 rpm) to allow the precursor liquid solvent to evaporate and the liquid to dry, and a second step at a second speed (e.g., 6000 rpm) to remove excess dried precursor from the edges of the substrate surface.

FIG. 4 is schematic diagram showing the annealing furnace 40 that may be employed in the substrate pre-annealing step 12 and the YIG/GGG annealing step 20 in the inventive MOD YIG epitaxial nanofilm fabrication process of the present invention as shown in FIG. 2. While countless sintering and annealing furnace configurations and variations are known, in a most essential aspect the furnace used in the present inventive process is a quartz tube annealing furnace that includes a supply of high purity research grade oxygen 41 fed through a process and control valve, such as a mass flow controller 42, which measures and controls the flow of the oxygen into the inner passage 43 of the furnace quartz tube 44. Heating elements 45 surround a portion of the quartz tube and provide a constant working temperature of 1100° C. under the control of a programmable furnace control box 46. Oxygen flowing out from the furnace is passed through a gas bubbler 47 and then discharged as exhaust into the atmosphere 48.

Figure 5:
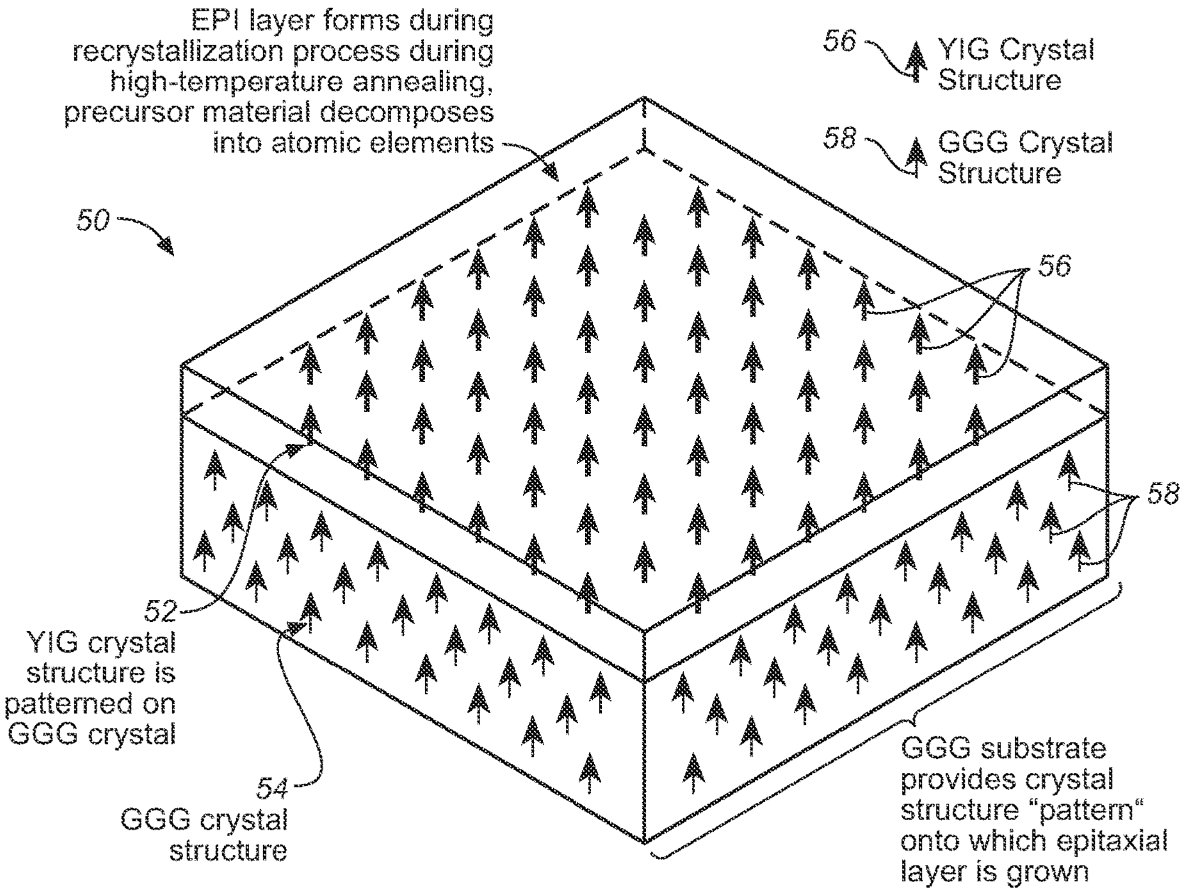
FIG. 5 is a highly schematic diagram showing the structural composition of single layer of epitaxial YIG nanofilm as produced in the inventive process.

Looking next at FIG. 5, there is shown in a schematic perspective view the crystal structures 50 of a single crystal layer epitaxial YIG nanofilm 52 on a GGG substrate also having a crystal substrate 54. During fabrication, the YIG epitaxial layer forms during the high temperature annealing step during crystallization (24 and 20, respectively, in FIG. 2). Testing and analysis reveal that the individual grains of the YIG crystal and GGG crystal structures, 56, 58, are aligned in their orientations.

The single crystal YIG on GGG epitaxial growth structure on single layer 50 nm thick YIG nanofilms was confirmed by several well-known measurement techniques. FIG. 6B and FIG. 7 provide EBSD and XRD measurement proof of the single crystal nature of the MOD YIG epitaxial crystal ("YIG/GGG") samples produced by the present invention.

Figure 6A:
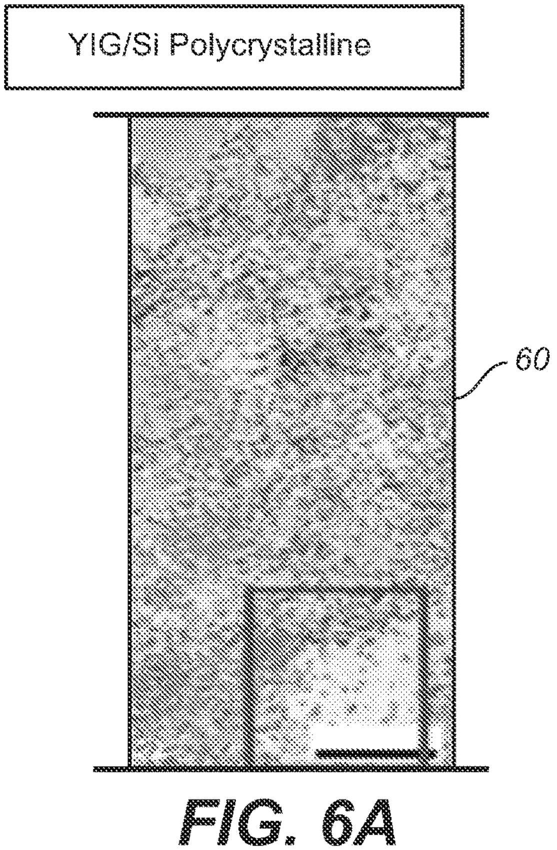
FIG. 6A is a graphical display of the distribution of the orientation of individual grains of the polycrystalline structure of an MOD epitaxial nanofilm fabricated on a silicon substrate.
Figure 6B:
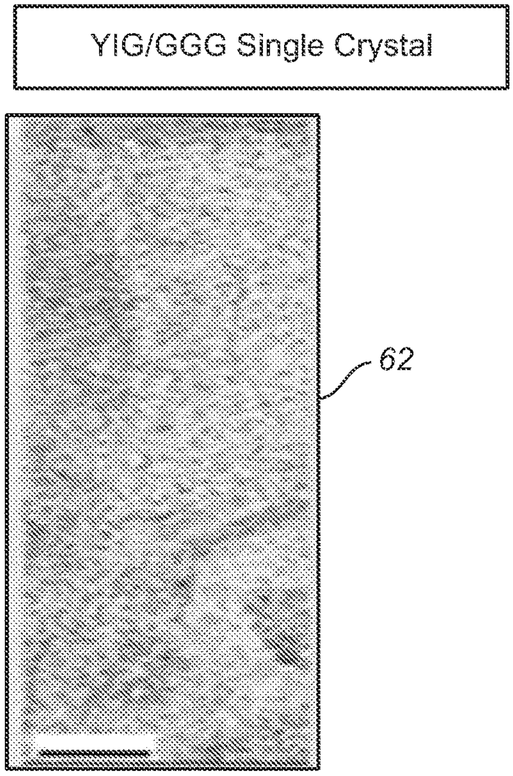
FIG. 6B, to contrast with FIG. 6A, is a graphical display of the distribution of the orientation of individual grains of the single crystal structure of an MOD epitaxial nanofilm fabricated on a GGG(111) substrate as in the inventive process.
Figure 7:
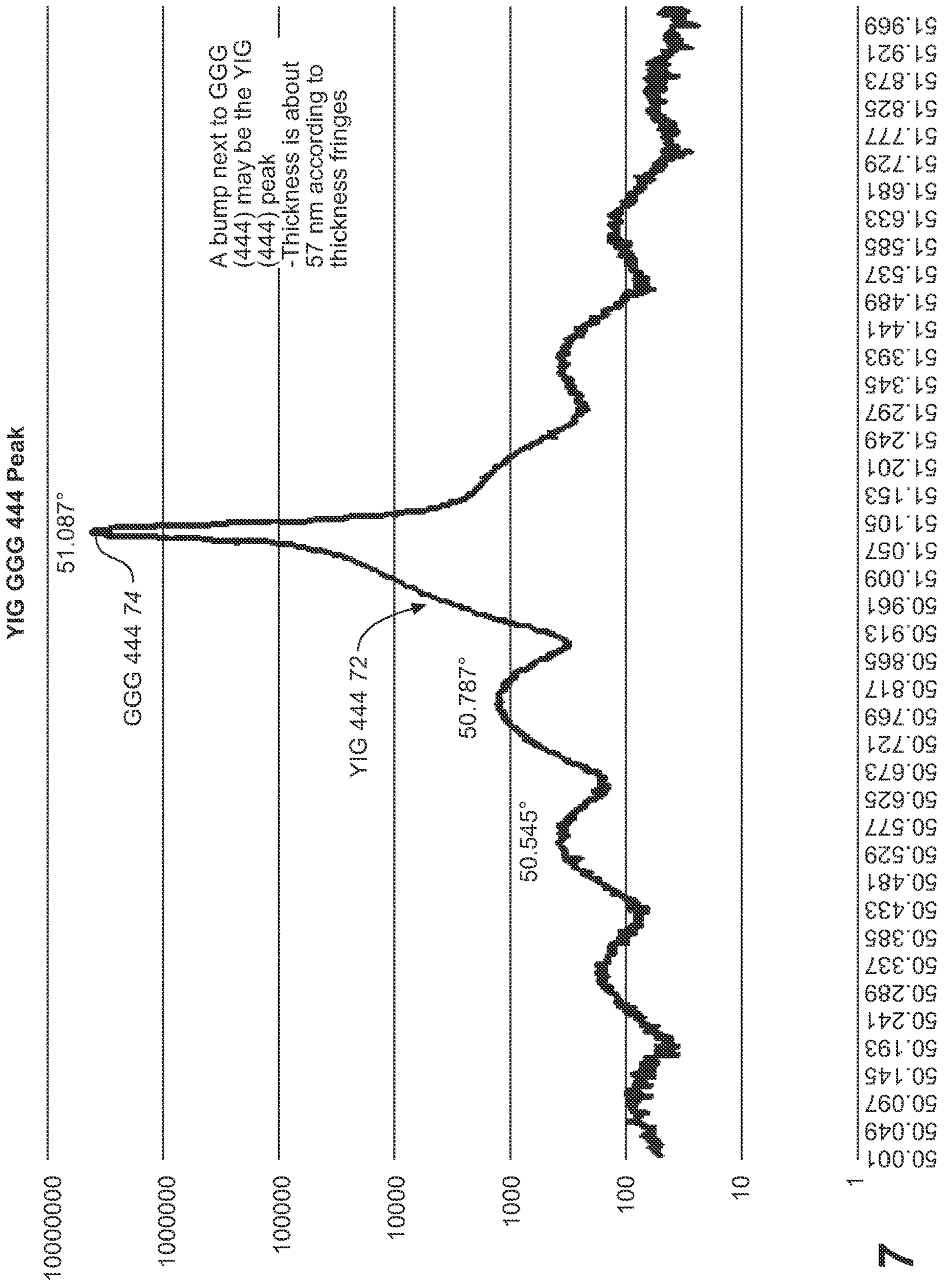
FIG. 7 is a graph illustrating XRD data of a single layer of YIG nanofilm epitaxially produced on a GGG(111) substrate.

FIGS. 6A and 6B provide contrasting graphic displays of the polycrystalline structure of a MOD YIG nanofilm disposed on a silicon substrate 60 (FIG. 6A) and a MOD YIG epitaxial nanofilm disposed on a GGG(111) substrate 62 made using the inventive process. EBSD measurements demonstrate the single crystal nature of the inventive MOD EPI YIG film. FIG. 6B is a black-and-white copy of a color display in which the single crystal nature of the sample was indicated by a nearly uniform color record within the EBSD measurement. By contrast, the sample measurement shown in FIG. 6A is clearly polycrystalline, as demonstrated in the myriad shade variations (color variations in the original graphic display).

FIG. 7 is a graph 70 showing XRD data of a single layer YIG/GGG sample, clearly showing a YIG(444) peak (i.e., a shoulder) 72 next to a much larger peak of GGG(444) 74. YIG layer thickness is calculated from the XRD data to be 57 nm based on the measured fringes.

Figure 8:
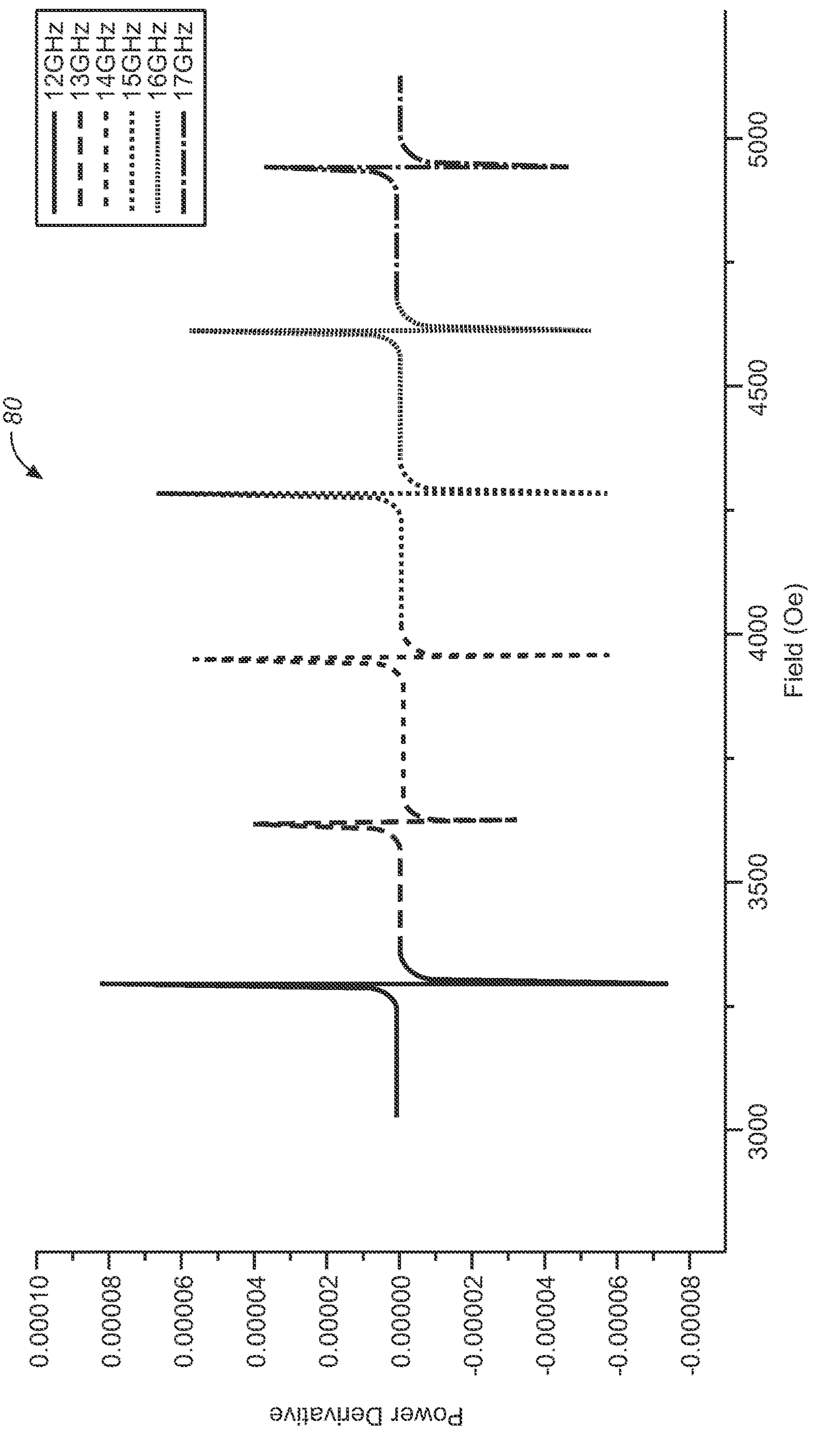
FIG. 8 is a graph showing FMR Gilbert damping constant measurements of single layer YIG on GGG sample, the low damping constant further validating the single crystal structure of the MOD YIG film under test.

FIG. 8 is a graph showing an FMR Gilbert damping constant measurement of single layer YIG/GGG sample. The low damping constant found here provides still further proof of the single crystal nature of the MOD YIG/GGG film.

Figure 9:
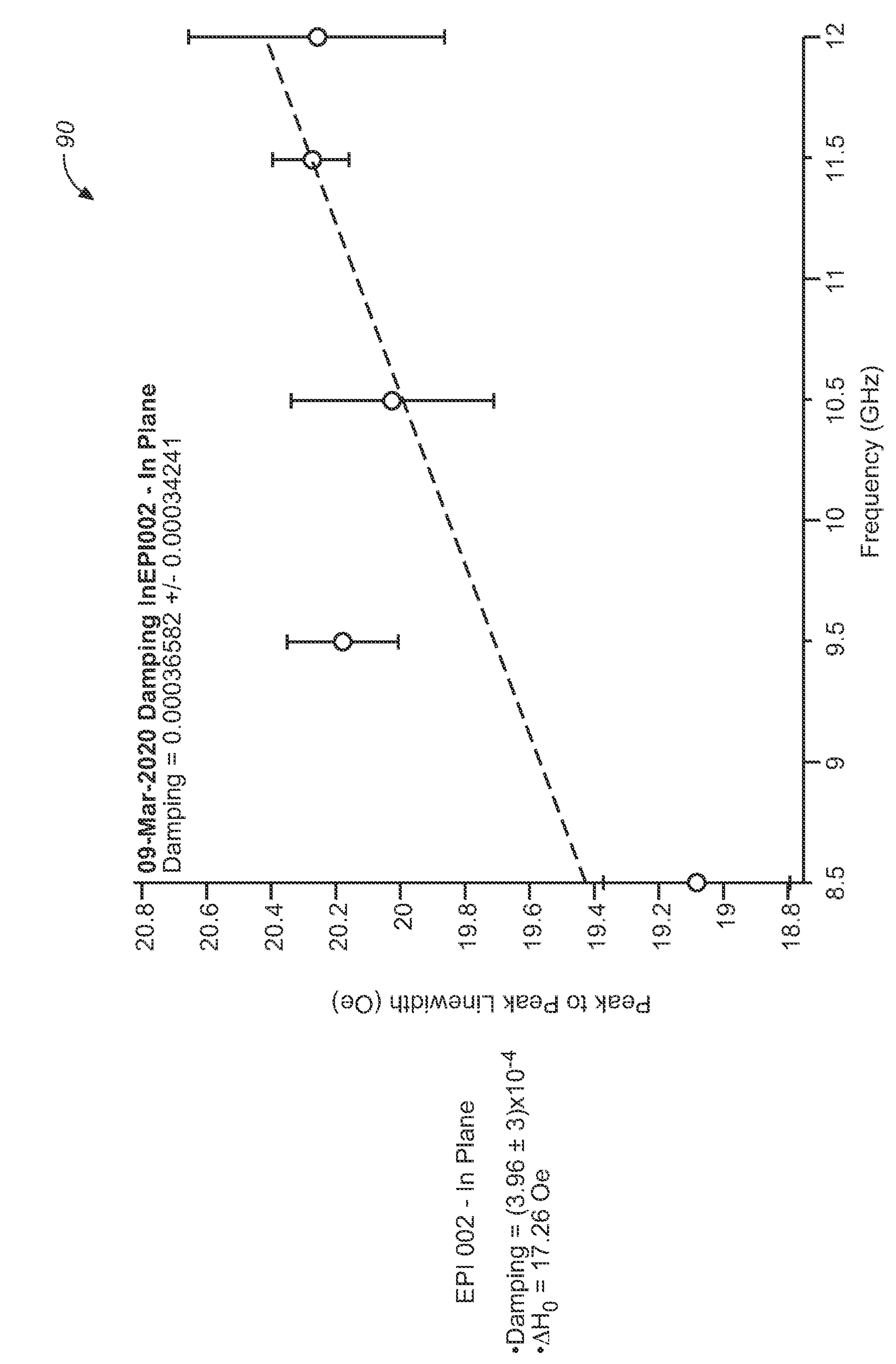
FIG. 9 is a graph showing FMR Gilbert damping constant measurement results and inhomogeneous damping constant ΔH0 of a MOD epitaxial sample on GGG (different from that of the sample measured in FIG. 8) as measured at a different test facility.

FIG. 9 is another graph 90 showing an FMR Gilbert damping constant as measure at a facility different from the facility that tested the samples for the FIG. 8 graph. With FIG. 8, this graph validates the finding that the Gilbert damping ratios of the YIG/GGG is in the range of 0.0003 to 0.0004. Such low damping ratio numbers again demonstrate the single crystal nature of the MOD YIG/GGG epitaxial samples.

Test Results: It should be noted that FMR measurements are the combined results of magnetic and RF microwave measurements. The measured FMR data is reduced by a curve-fitting procedure involving the Kittel equation and the Landau-Lifshitz linearized model relationship between AH and excitation frequency The Kittel equation is $Fr=(\Upsilon/2\pi)\sqrt{[H(H+4\pi Ms)]}$ The Landau Lifshitz linearized model relationship is $\Delta H=\Delta H0+(4\pi\alpha Fr/\sqrt{3})/\Upsilon$ In the Kittel equation, Fr is the ferromagnetic resonant frequency, H is the DC magnetic bias field, $4\pi Ms$ is the saturation magnetization, $\Upsilon$ is the gyromagnetic ratio, $\Delta H0$ is the inhomogeneous line broadening, and $\alpha$ is the Gilbert damping ratio. The Kittel equation is used to determine $\Upsilon$ and $4\pi Ms$, the Landau-Lifshitz linear relationship is used to determine $\Delta H0$ and $\alpha$.

Figure 12:
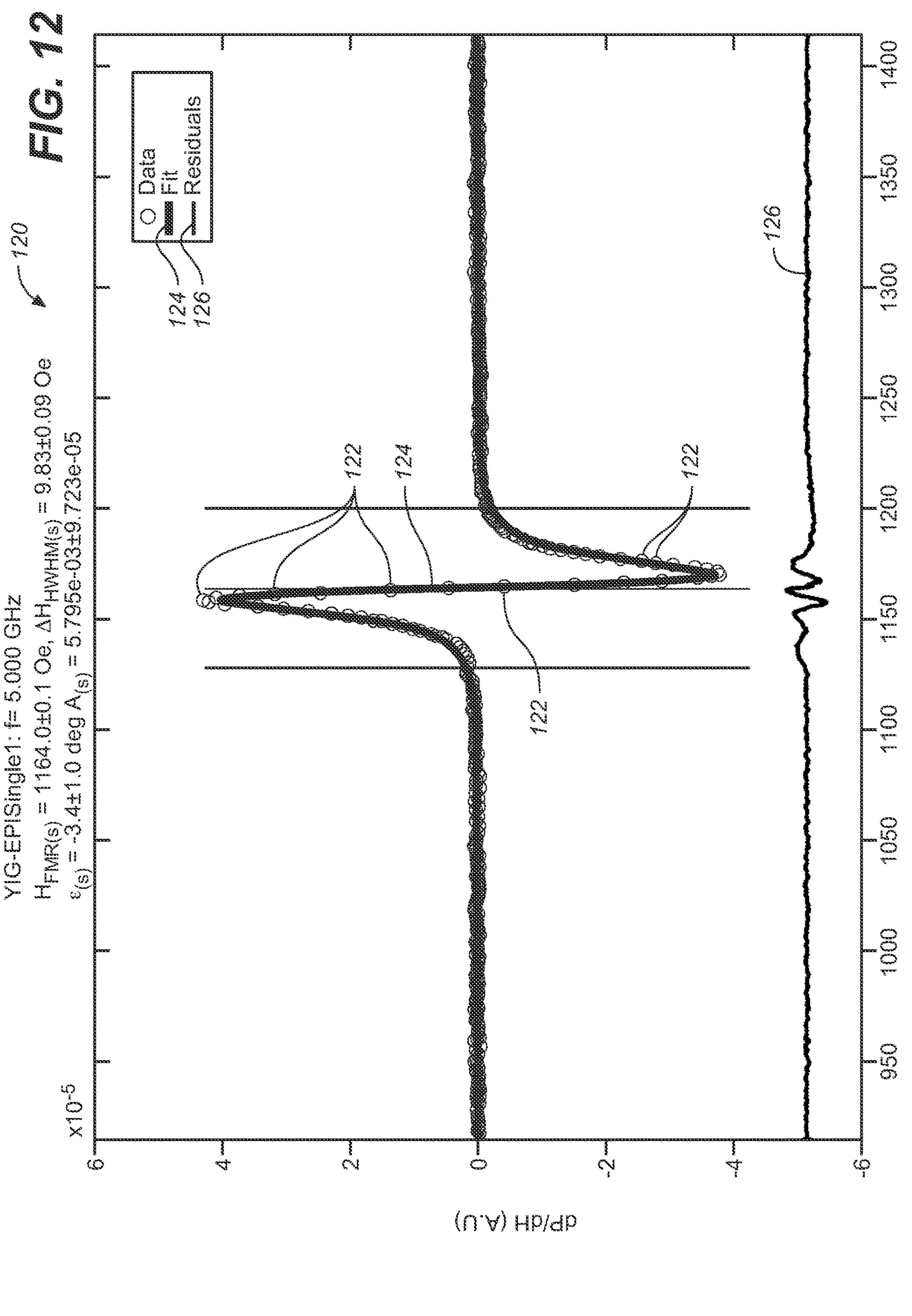
FIG. 12 is a graph showing the FMR wave form as measured for a single layer of epitaxial YIG/GGG nanofilm at 5 GHz.

Looking ahead to FIG. 12 as an example, experimental FMR waveform data is first mathematically fitted to a perfect Lorentzian wave form, as shown in the graph 120 of FIG. 12. The numerous circles 122 represent experimental data points. The solid line 124 is a "Best fit" Lorentzian wave form corresponding to the experimental FMR waveform data. A second solid line 126, just below the waveform line, is a measure of the deviation between the experimental data points and the "Best fit" Lorentzian waveform. With fitting accomplished, the FMR parameters associated with each of the fundamental equations are extracted and presented as a part of the final data. In this way, experimental data is converted into a sample's FMR parameters such as $4\pi Ms$, $\Upsilon$, $\Delta H0$, and a.

FMR tests for the inventive YIG/GGG samples have resulted in very small sample-to-sample measurement variations in ϒ and 4πMs for samples of up to three YIG layers. However, significant sample-to-sample variations in the Gilbert damping ratio, α, and the inhomogeneous line broadening parameter ΔH0 have been observed. All of the conforming FMR parameters agree closely with well-established values for those parameters using PLD, LPE, and sputtered nanofilm deposition reported by researchers. Initially, measurements of the Gilbert damping ratio was 0.0003, a very good number relative to other types of epitaxial YIG films. Recent measurements closer to the time of filing the instant application have indicated a Gilbert damping ratio spread over the range of 0.0003 to 0.006, slightly higher than data obtained with PLD and LPE techniques. Looking ahead to the table 180 of FIG. 18 (discussed more fully below), there is shown a summary of the measured data, which is based on in-plane magnetic field biasing.

Figure 10:
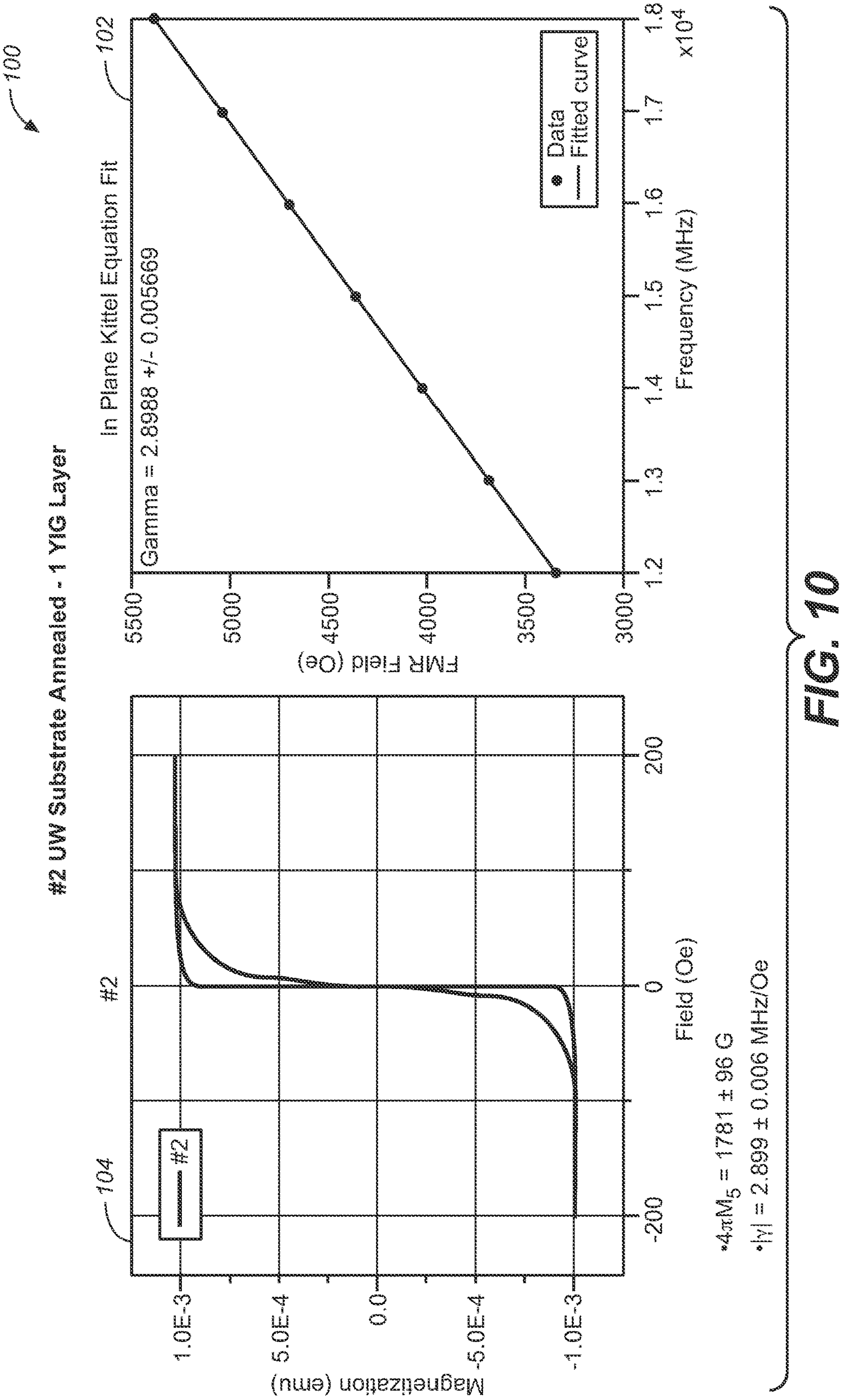
FIG. 10 includes side-by-side graphs showing, respectively, gyromagnetic ratio and 4πMs as measured by FMR and VSM techniques, showing an extremely low value of coercivity, indicating that epitaxial YIG/GGG nanofilms are extremely soft magnetics.

Looking back now at FIG. 10, there is shown side-by-side graphs 100 including a first graph showing gyromagnetic ratio (right graph 102) and a second graph showing saturation magnetization, 4πMs, (left graph 104), as measured by FMR and VSM techniques. The extremely low value of coercivity indicates that the tested epitaxial YIG/GGG nanofilms are extremely soft magnetics. YIG/GGG samples were able to be lifted by small permanent magnets, thus indicating the presence of soft magnetic properties in the samples.

4πMs data was consistent from sample to sample for up to three YIG layers, using both 5 mm×5 mm and 10 mm×10 mm samples. Values range from 1650 to 1750 Gauss, corresponding closely to established bulk YIG values (1750 Oe.). Coercivity data was low and consistent for all samples, in the range of (1 to 5 Oe). Low coercivity data indicates that epitaxial YIG film is a very soft magnet—again, see FIG. 10, and FIG. 11, discussed below.

The gyromagnetic ratio data was very consistent for all samples (2.80 MHz per Oe.)

The best values of ΔH0 (inhomogeneous linewidth) and a (Gilbert damping) data were obtained with 5 mm×5 mm samples. Larger sample sizes have higher values, and it is hypothesized that the larger sizes may be introducing inhomogeneities in the YIG film, affecting the values of α and inhomogeneous linewidth.

Figure 11:
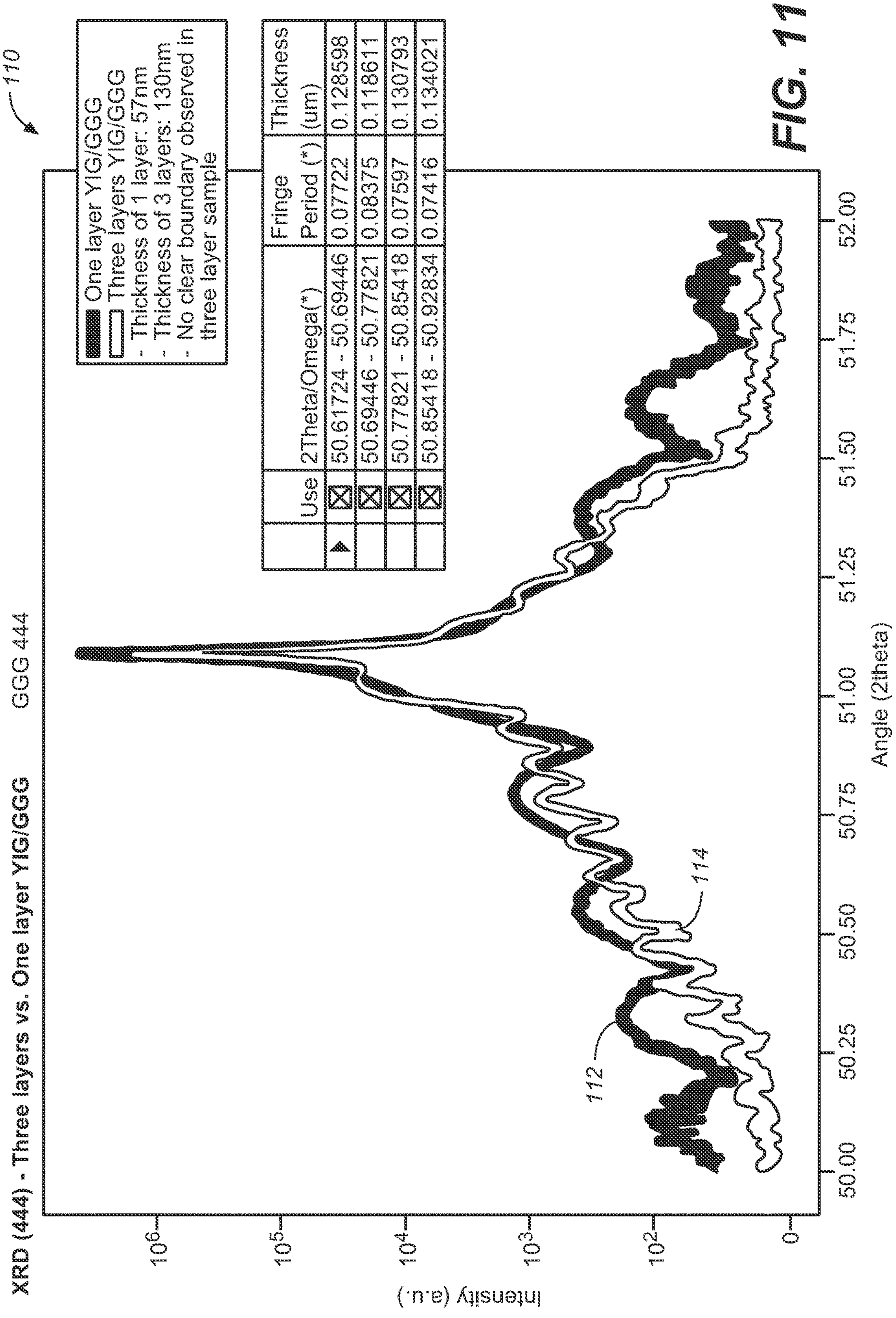
FIG. 11 is a graph showing XRD data for both one-layer and three-layer epitaxial YIG/GGG nanofilms indicating layer thicknesses of 57 nm for a single layer and 130 nm for three layers.

XRD measurements of both single layer and three-layer YIG/GGG samples are shown in the graphs 110 of FIG. 11. The data was used to calculate layer thickness, which is 57 nm for a single layer and 130 nm for three layers. FIG. 11 shows the FMR wave 112 form as measured for a single layer of epitaxial YIG/GGG nanofilm at 5 GHz, as well as the wave form 114 measured for three layers of YIG/GGG.

Figure 13:
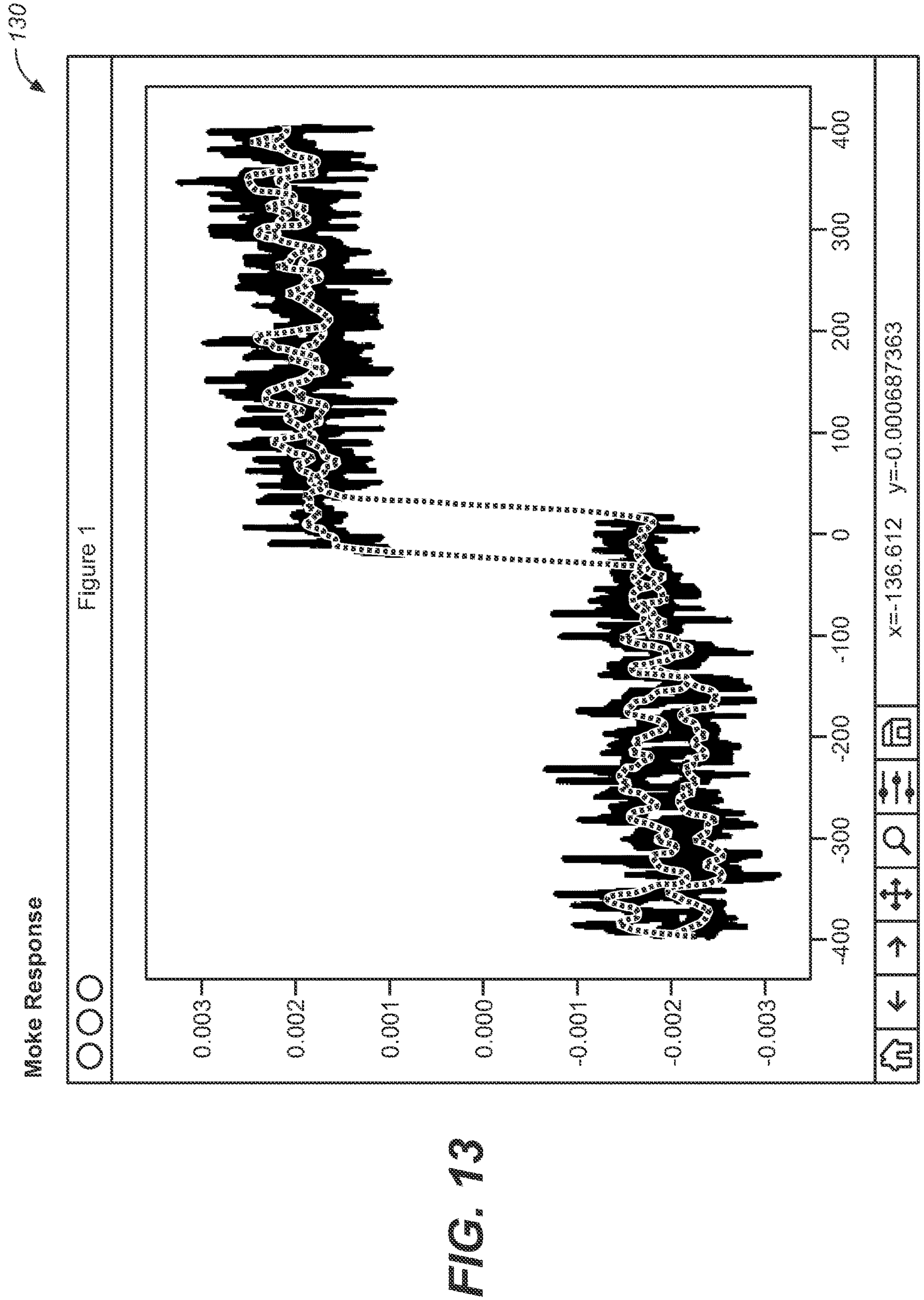
FIG. 13 Initial MOKE data is a qualitatively related to the VSM coercivity data shown in FIG. 10.

The coercivity data measured by VSM, as shown in FIG. 10, is clearly visible in the graph 130 of FIG. 13, where an uncalibrated measurement was made by MOKE (i.e., Magnetic Optical Kerr Effect) techniques. In MOKE measurements a beam of light is shined at a given angle of incidence on to a sample while a magnetic field is simultaneously applied to the sample at a given angular relationship to the light beam. There are several different relationships that may exist in the angular relationship between the light beam and the magnetic field. It is these angular relationships that determine the MOKE measurement explored. FIG. 13 shows a strong qualitative relationship between the MOKE measurement and the VSM data presented in FIG. 10. However, at present there is no MOKE calibration data, and it is therefore not yet possible to quantitively relate the data in FIG. 10 with the data in FIG. 13.

Figure 14:
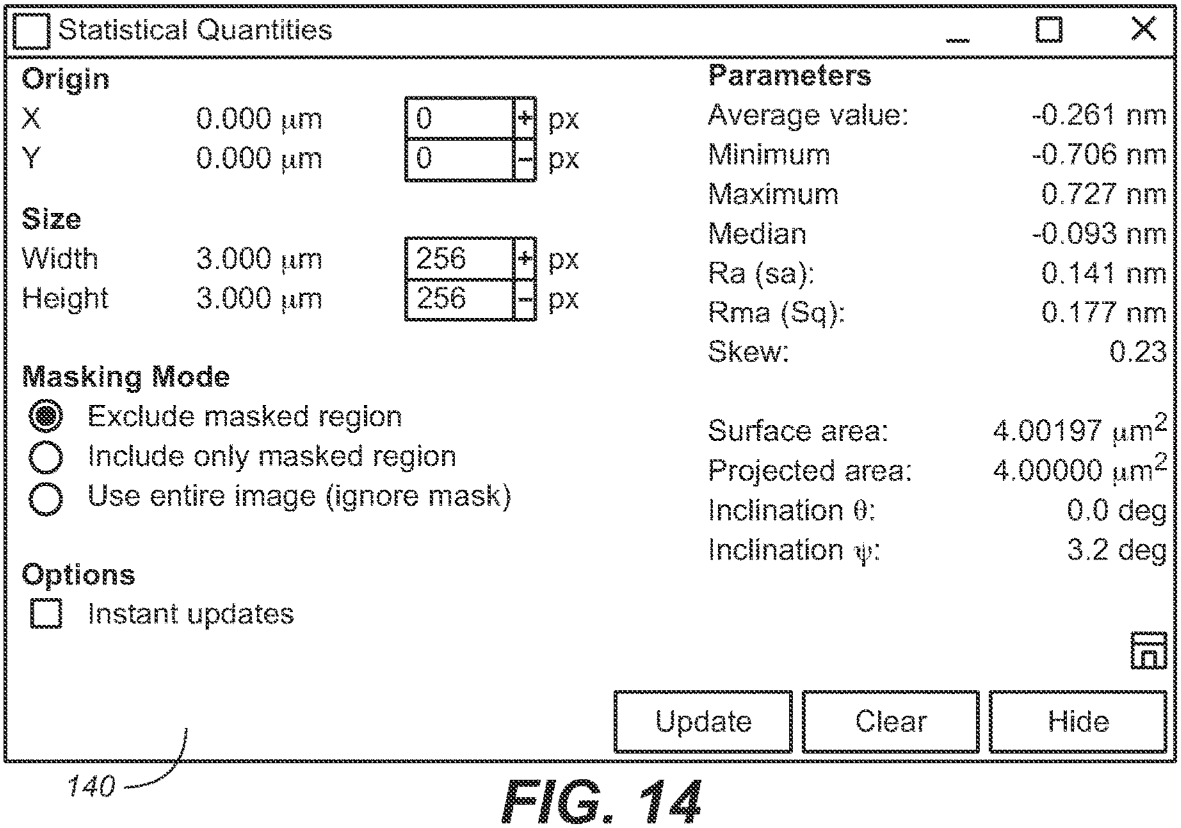
FIG. 14 is a printout of measured surface roughness of a single layer sample YIG/GGG nanofilm indicating an RMS of 0.177 nm as measured by AFM.
Figure 15:
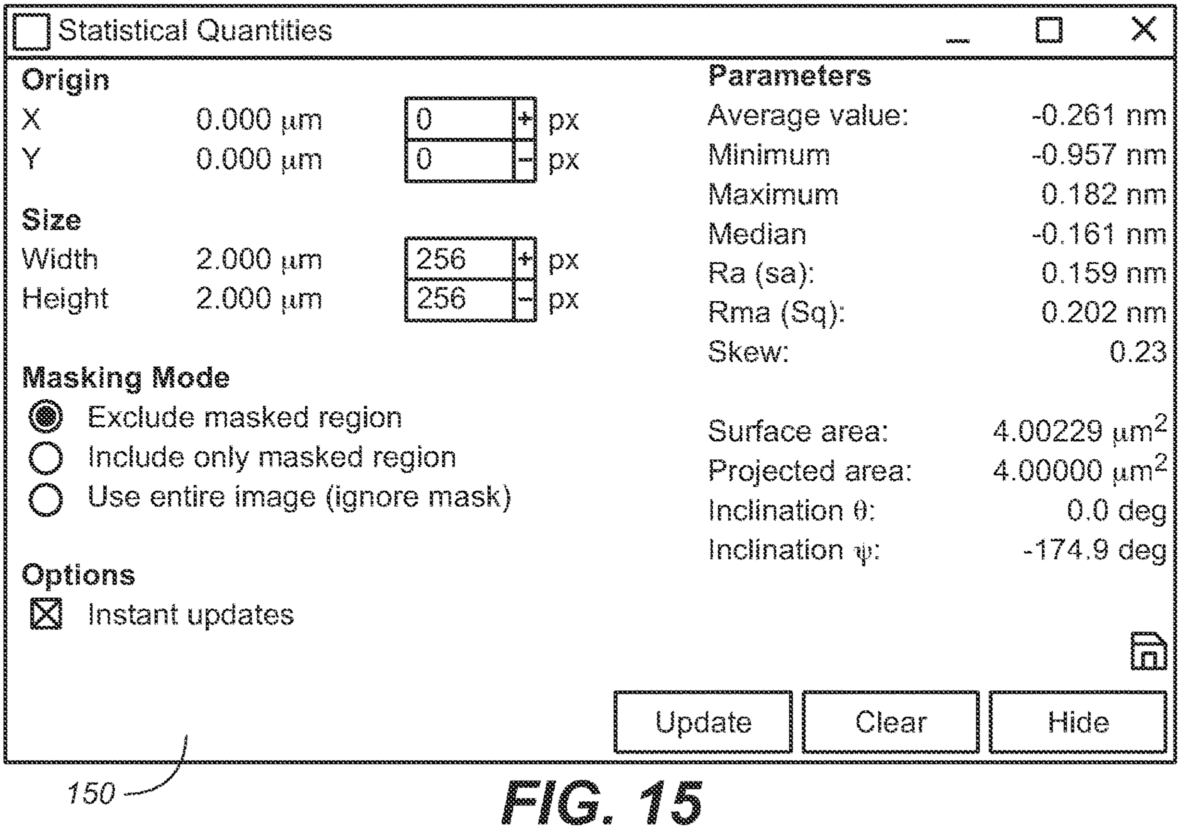
FIG. 15 is a printout showing the surface roughness of a three-layer sample similarly measured; RMS of 0.202 nm.
Figure 16:
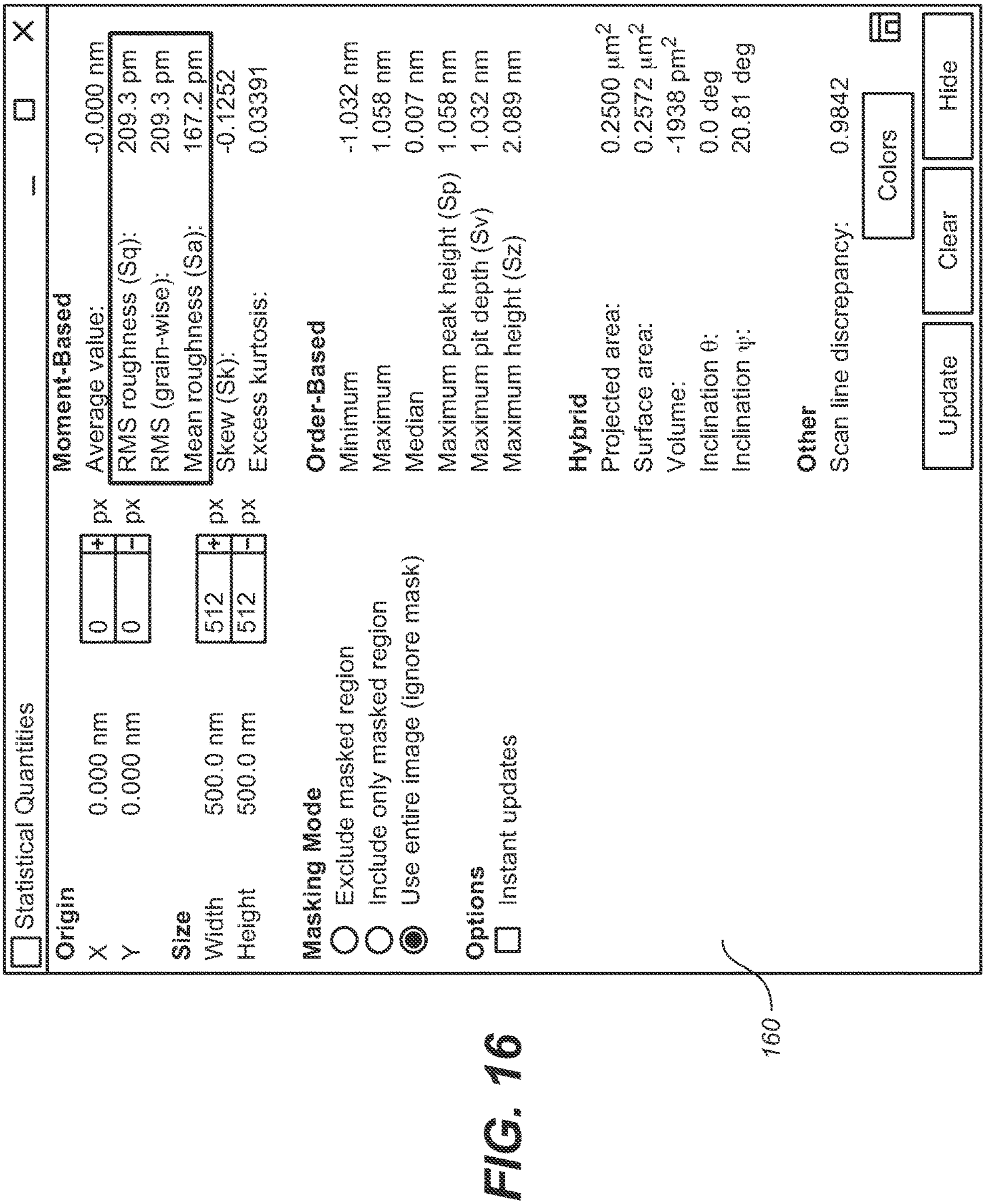
FIG. 16 is printout of measured parameters showing the surface roughness of a ten-layer sample; RMS of 0.209 nm.

The surface roughness of multilayer YIG/GGG samples ranges from RMS 0.10 nm to 0.20 nm, as shown in the printouts of the quantitative data, 140, 150, and 160, respectively, of FIGS. 14-16. Up to 10 layers of YIG have been fabricated, and the measured surface roughness indicates a surface roughness of less than RMS 0.20 nm occurring at the top layer of the stack, no matter how many layers of YIG/GGG are measured.

In order, the data 140 of FIG. 140 shows a surface roughness of a single layer sample to be RMS 0.15, as measured by AFM.

The data 150 of FIG. 15 shows the measured surface roughness of a three-layer sample to be RMS 0.20 nm, also as measured by AFM.

Figure 17:
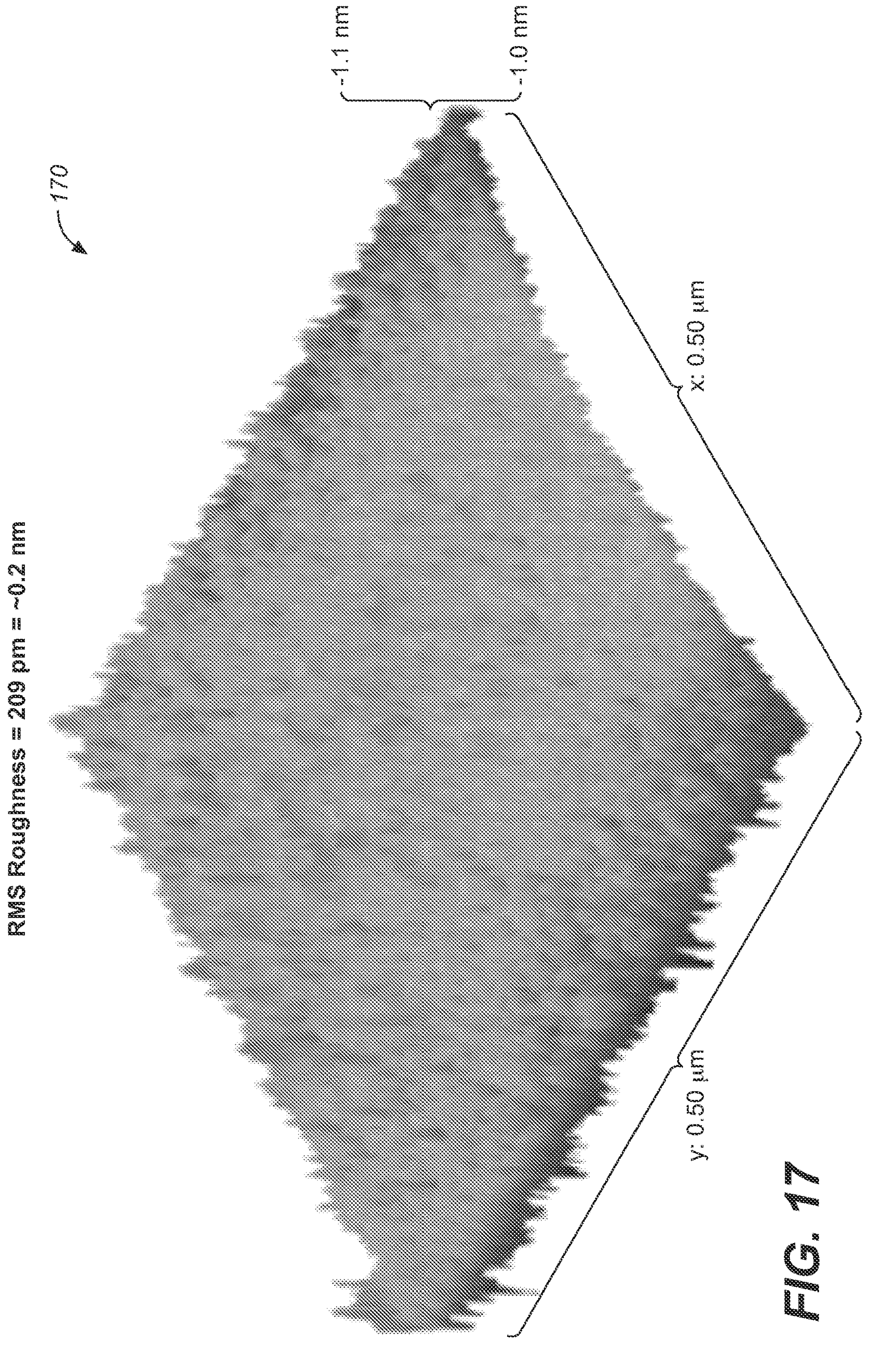
FIG. 17 is a graphical display showing the ten-layer YIG/GGG sample as measured in FIG. 16; and RMS surface roughness of 0.209 nm as measured by AFM methods.

The data 160 of FIG. 16, shows the measured surface roughness of a ten-layer sample of YIG/GGG to be RMS 0.20 nm, as measured by AFM. FIG. 17 is a graphic display 170 of the surface of the ten-layer YIG/GGG sample.

Conclusions: a fully functional YIG oscillator or YIG filter requires the presence of a magnet to provide a tunable source of the magnetic bias field necessary for adjusting the oscillators or filter's ferromagnetic resonance (FMR) to a desired operating frequency. Magnetic bias field can be supplied in one of three ways: (1) an electromagnet; (2) a permanent magnet; and (3) a combination of electromagnetic and permanent magnets.

The advantages and disadvantages of each are as follows. Electromagnets are current tunable for selecting the FMR frequency of choice. However, at high frequencies, tuning currents may become excessive, generating undesirable amounts of heat. Permanent magnets require no tuning current but are confined to a single FMR frequency of operation. The combination of an electromagnet and a permanent magnet allows for low tuning current operation near the FMR frequency associated with the permanent magnet, but can be tuned to higher or lower frequencies, using a minimum of electromagnet current.

The MOD process is well known for growing crystals of various materials. However, the MOD YIG epitaxial fabrication process disclosed herein produces single crystal epitaxial YIG nanofilms, and this is the first instance of such an achievement. The advantages of the nanofilm produced by the inventive fabrication process over the known MOD YIG epitaxial fabrication processes may be appreciated by reference to FIG. 18, which is a comparison table 180 comparing FMR data for the YIG/GGG epitaxial nanofilm as fabricated by the inventive method with other leading YIG epitaxial processes.

Electroless Gold Plating: Once fabricated, gold deposition may be employed to connect the YIG nanofilm to other circuit elements, such as amplifiers and oscillators, making thereby incorporating the nanofilm into a complete working system. Gold depositions makes this interconnection possible. In purpose and effect, the gold is an enabler by connecting the nanofilm to other components that make it truly useful.

To that end, the YIG/GGG nanofilm can be electroless plated with gold metal using the following process:

First, the following chemicals and supplies are provided: (1) gold(I) sodium thiosulfate hydrate; (2) L-ascorbic acid sodium salt; (3) diammonium hydrogen phosphate (DAP); and (4) ammonium dihydrogen phosphate (ADP).

Buffer Solution: Next, a pH 6 buffer stock solution is prepared as follows: (1) preparing 400 mL distilled water (DIW) in a beaker, controlling the temperature to hold at with a hotplate and a pH probe; (2) then 12.3 g of DAP is added into the water with magnetic stirring until fully dissolved.

While monitoring the pH level, the ADP is added into the solution until the pH probe reads 5.9-6.1.

Substrate Preparation: Next, the substrate is prepared as follows: (1) first it is cleaned with a 3 minute ultraviolet light (UV) clean; (2) next it is rinsed with DIW, isopropyl alcohol (IPA), and acetone; (3) then it is dried with nitrogen flow.

Next, the substrate is spincoated and pattern photoresist with UV lithography, and then developed.

An electron beam is then used to evaporate 1 nm Ti+175 nm Au, keeping the chamber under vacuum between Ti and Au layers to prevent the formation of titanium oxide.

The photoresist is stripped and the sample cleaned. Observations are recorded as necessary.

Electroless plating process: (1) a 50 mL pH 6 buffer stock is prepared, the temperature controlled by holding it at 30° C. with a hotplate and a magnetic stirrer. (2) of ascorbic acid salt is slowly added into solution until fully dissolved. (3) 0.1225 g of gold sodium thiosulfate is slowly added into solution and allowed to fully dissolve. (4) Using a holding apparatus, the prepared sample is immersed into solution with normal of Au-deposited side being antiparallel to flow of the stirred liquid. (5) Plating is allowed to occur for 1 hour. (6) Finally, the plated nanofilm is rinsed with DIW, IPA, and acetone.

The above disclosure is sufficient to enable one of ordinary skill in the art to practice the invention and provides preferred modes of practicing the invention presently contemplated by the inventors. While there is provided herein a full and complete disclosure of the preferred embodiments, the description is not desired to limit the invention to the exact process steps nor the exact resulting product made by the inventive process. Various modifications, alternative steps, changes and equivalents will readily occur to those skilled in the art and may be employed, as suitable, without departing from the true spirit and scope of the invention. Such changes might involve alternative materials, components, structural arrangements, sizes, shapes, forms, functions, operational features or the like.

For instance, the variant liquid precursor compositions are contemplated and within the scope of the present invention.

Therefore, the above description and illustrations should not be construed as limiting the scope of the invention, which is defined by the appended claims.

What is claimed as invention is:

1. A metallic organic decomposition (MOD) epitaxial growth process for making a Y3Fe5O12 (YIG) nanofilm having at least one layer, the method comprising the steps of:

providing a crystalline substrate having a planar surface;

coating the planar surface of the crystalline substrate with a precursor liquid mixture consisting of yttrium oxide, iron oxide, one or more acids, and one or more organic substances;

evenly distributing the precursor liquid to evenly coat the crystalline substrate surface;

drying the precursor liquid on the crystalline substrate surface to form a thin film YIG layer;

pyrolyzing the thin film YIG layer in a furnace;

crystallizing the thin film YIG layer in an annealing furnace at high temperature to remove all organic material from the thin film YIG layer and to promote single crystal crystallization to occur across the entire thin film YIG layer;

wherein the resulting nanofilm has a surface roughness between RMS 0.10 nm and 0.20 nm regardless of the number of YIG nanofilm layers; and wherein the resulting multilayer nanofilm the YIG nanofilm ferromagnetic resonance linewidth at frequencies above 10 GHz is reduced due to two magnon scattering, and further wherein the Q factor of the YIG nanofilm's ferromagnetic resonance rises as a function of frequency.

2. The method of claim 1, further including making a plurality of stacked thin film YIG layers to yield a multilayer YIG nanofilm having a total thin film thickness in the range of 50 nm to 500 nm, in steps of approximately 50 nm.

3. The method of claim 1, where the crystalline substrate is a synthetic crystalline substrate having a lattice constant substantially identical to that of YIG.

4. The method of claim 3, wherein the crystalline substrate is gadolinium gallium garnet (Gd3Ga5O12, GGG) 111-oriented substrate.

5. The method of claim 4, further including pre-annealing the GGG substrate in oxygen before the coating step.

6. The method of claim 1, wherein the crystalline substrate is a synthetic crystalline substrate having a surface roughness of RMS 0.10 nm to RMS 0.25 nm.

7. The method of claim 1, wherein the coating step involves using a spinner at speeds between 3000 rpm to 6000 rpm.

8. The method of claim 7, wherein the coating step includes a first spinning step to evenly coat the substrate with the liquid precursor, said first spinning step carried out at speeds at a first spinning speed and a second spinning step carried out at a second spinning speed higher than the first spinning speed to remove dried precursor from the edges of the substrate.

9. The method of claim 1, wherein the drying step involves heating the thin film YIG layer from 1 hour to 24 hours at a temperature of between room temperature of 20 C to 150 C, inclusive.

10. The method of claim 1, wherein the crystalizing step involves annealing involves heating the YIG thin film to approximately 1100 C for approximately 4 hours.

11. The method of claim 10, wherein the annealing is conducted in a quartz tube furnace with a flowing research grade oxygen.

12. The YIG nanofilm of 1, wherein the in-plane ferromagnetic saturation magnetization of the YIG nanofilm is within the range of 1600 gauss to 1800 gauss.

13. The YIG nanofilm of claim 1, wherein in-plane gyromagnetic ratio of the YIG nanofilm is in the range of 2.78 MHz/Oe to 2.82 MHz/Oe.

14. The YIG nanofilm of claim 1, wherein the in-plane ferromagnetic inhomogeneous linewidth of the YIG nanofilm is in the range of 6 Oe to 20 Oe.

15. The YIG nanofilm of claim 1, wherein the in-plane magnetic coercivity of the YIG nanofilm is within the range of 1 Oe to 5 Oe.

16. The YIG nanofilm of claim 1, wherein the Gilbert damping ratio of the YIG nanofilm is in the range of 0.0003 to 0.0010.

17. A metallic organic decomposition (MOD) epitaxial growth process for making a Y3Fe5O12 (YIG) nanofilm, the method comprising the steps of:

(a) providing a GGG(111) substrate having a substantially planar substrate surface;

(b) coating the GGG(111) substrate surface with a precursor liquid mixture consisting of yttrium oxide, iron oxide, one or more acids, and one or more organic substances;

(c) evenly distributing the precursor liquid mixture across the GGG(111) substrate surface;

(d) drying the precursor liquid on the crystalline substrate surface to form a thin film YIG layer;

(e) crystallizing the thin film YIG layer at high temperature in an annealing furnace such that in a single process the YIG layer is pyrolyzed to remove all organic material, annealed to remove any remaining organic material, and crystallize the YIG layer such that the elemental meal atoms of the YIG lattice combine with oxygen atoms to form a single crystal YIG film according to the lattice pattern of the substantially identical GGG(111) substrate; and further including the step of repeating (b) through (e) to make a YIG nanofilm having multiple layers, wherein steps (c) and (d) involve using a previously crystallized layer of YIG nanofilm as the substrate surface.

18. A metallic organic decomposition (MOD) epitaxial growth process for making a Y3Fe5O12 (YIG) nanofilm, the method comprising the steps of:

(a) providing a GGG(111) substrate having a substantially planar substrate surface;

(b) coating the GGG(111) substrate surface with a precursor liquid mixture consisting of yttrium oxide, iron oxide, one or more acids, and one or more organic substances;

(c) evenly distributing the precursor liquid mixture across the GGG(111) substrate surface;

(d) drying the precursor liquid on the crystalline substrate surface to form a thin film YIG layer;

(e) crystallizing the thin film YIG layer at high temperature in an annealing furnace such that in a single process the YIG layer is pyrolyzed to remove all organic material, annealed to remove any remaining organic material, and crystallize the YIG layer such that the elemental meal atoms of the YIG lattice combine with oxygen atoms to form a single crystal YIG film according to the lattice pattern of the substantially identical GGG(111) substrate; and wherein after a first crystallization step (e), the method further includes repeating steps (b) through (d) to make a YIG nanofilm having multiple layers, wherein steps (c) and (d) involve using a previously dried layer of YIG nanofilm as the substrate surface, and after a predetermined number of layers have been deposited and dried, a final crystallization step (e) is performed to merge all layers into a single crystal layer.

* * * * *